(12) United States Patent
Kikuchi et al.

(10) Patent No.: US 12,463,022 B2
(45) Date of Patent: Nov. 4, 2025

(54) PLACING TABLE AND SUBSTRATE PROCESSING APPARATUS

(71) Applicant: TOKYO ELECTRON LIMITED, Tokyo (JP)

(72) Inventors: Yusuke Kikuchi, Yamanashi (JP); Masato Shinada, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/477,047

(22) Filed: Sep. 28, 2023

(65) Prior Publication Data

US 2024/0120182 A1 Apr. 11, 2024

(30) Foreign Application Priority Data

Oct. 11, 2022 (JP) ................. 2022-163291

(51) Int. Cl.
| | |
|---|---|
| H01J 37/32 | (2006.01) |
| C23C 14/35 | (2006.01) |
| C23C 14/50 | (2006.01) |
| H01J 37/34 | (2006.01) |

(52) U.S. Cl.
CPC ...... *H01J 37/32724* (2013.01); *C23C 14/352* (2013.01); *C23C 14/50* (2013.01); *H01J 37/32697* (2013.01); *H01J 37/32715* (2013.01); *H01J 37/345* (2013.01); *H01J 2237/002* (2013.01); *H01J 2237/2007* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 6,210,541 B1 | 4/2001 | Cooney, III et al. | |
| 6,239,403 B1* | 5/2001 | Dible | H01J 37/3299 219/121.52 |
| 10,189,230 B2 | 1/2019 | Toshima et al. | |
| 2002/0078550 A1* | 6/2002 | Shimazawa | C23C 14/568 29/603.07 |
| 2007/0209933 A1* | 9/2007 | Yoshioka | H01L 21/6833 204/298.31 |
| 2008/0226838 A1* | 9/2008 | Nishimura | C23C 16/4558 118/723 R |
| 2015/0132551 A1* | 5/2015 | Cao | C23C 14/0676 428/212 |
| 2016/0071707 A1 | 3/2016 | Furukawa et al. | |

(Continued)

FOREIGN PATENT DOCUMENTS

| | | |
|---|---|---|
| JP | H11-343570 A | 12/1999 |
| JP | 2016-053202 A | 4/2016 |

(Continued)

*Primary Examiner* — Jason Berman
(74) *Attorney, Agent, or Firm* — Fenwick & West LLP

(57) ABSTRACT

There is a placing table comprising: an electrostatic chuck having a chuck electrode, wherein the electrostatic chuck is configured to attract and hold a substrate on a placing surface and to be rotatable; a freezing device having a contact surface in contact with or separated from a surface of the electrostatic chuck opposite to the placing surface and configured to cool the electrostatic chuck; and a power controller configured to superimpose a radio frequency (RF) bias voltage applied to the electrostatic chuck on a chuck voltage applied to the chuck electrode.

11 Claims, 4 Drawing Sheets

(56) References Cited

U.S. PATENT DOCUMENTS

2018/0001597 A1    1/2018   Toshima et al.
2019/0181028 A1*   6/2019   Patel ................... C23C 16/4586

FOREIGN PATENT DOCUMENTS

| JP | 2018-006452 A | 1/2018 |
| JP | 2021-506136 A | 2/2021 |
| WO | WO 2019/118320 A1 | 6/2019 |

* cited by examiner

PLACING TABLE AND SUBSTRATE PROCESSING APPARATUS

CROSS-REFERENCE TO RELATED APPLICATIONS

This application claims priority to Japanese Patent Application No. 2022-163291, filed on Oct. 11, 2022, the entire contents of which are incorporated herein by reference.

TECHNICAL FIELD

The present disclosure relates to a placing table and a substrate processing apparatus.

BACKGROUND

In the case of forming a copper (Cu) film by a sputtering method using physical vapor deposition (PVD), target particles adhered to a substrate grow until crystallization becomes stable. Therefore, as a particle diameter increases, roughness (surface roughness) of the Cu film increases. Hence, it is difficult to form a flat film at a nano level at which the film roughness is low. However, the grain growth of the target particles adhered to the substrate can be suppressed by lowering a temperature of the substrate during film formation, which makes it possible to make the film flat.

For example, Japanese Laid-open Patent Publication No. 2018-6425, which discloses a sputtering apparatus having an electrostatic chuck mechanism and a lower electrode capable of being supplied with a high frequency for bias, suggests that a stage is cooled to 209K (Kelvin) or lower during formation of a Cu film by sputtering.

For example, Japanese Laid-open Patent Publication No. H11-343570 discloses a method for depositing a copper metal layer for reducing agglomeration of copper metal particles during deposition in the case of depositing the copper metal layer suitable for a seed layer for a copper plating process on a substrate. This method includes: placing a substrate on a chuck; cooling the chuck and the substrate to a temperature lower than −100° C.; and performing sputtering deposition of a copper metal layer on the substrate while maintaining a temperature of the substrate to a level lower than −100° C. and at which a copper metal is deposited with low average surface roughness suitable for the seed layer for the copper placing process.

SUMMARY

The present disclosure provides a technique capable of efficiently attracting ionized sputtered particles to a placing table.

In accordance with an exemplary embodiment of the present disclosure, there is a placing table comprising: an electrostatic chuck having a chuck electrode, wherein the electrostatic chuck is configured to attract and hold a substrate on a placing surface and to be rotatable; a freezing device having a contact surface in contact with or separated from a surface of the electrostatic chuck opposite to the placing surface and configured to cool the electrostatic chuck; and a power controller configured to superimpose a radio frequency (RF) bias voltage applied to the electrostatic chuck on a chuck voltage applied to the chuck electrode.

DETAILED DESCRIPTION

Figure 1:
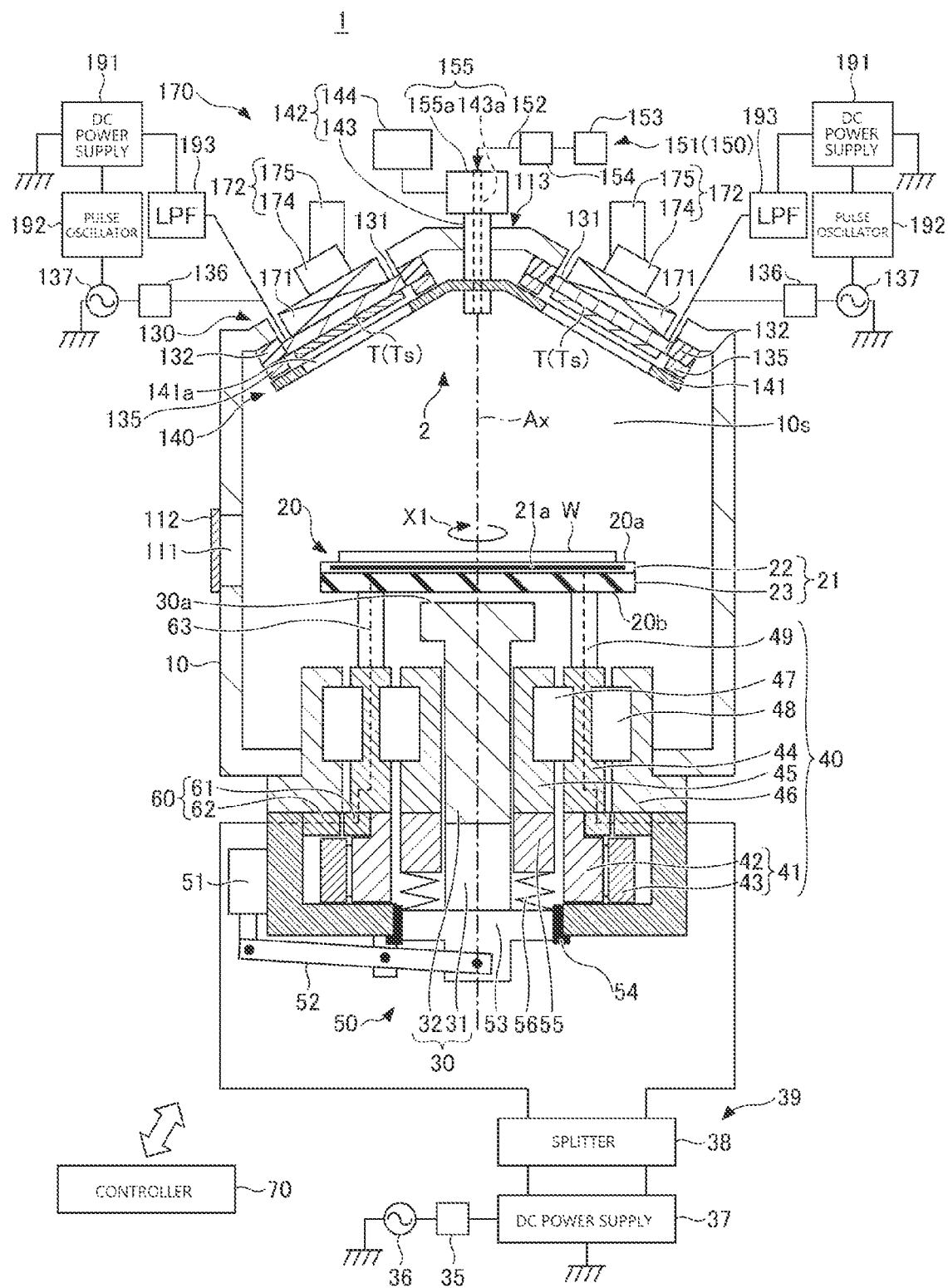
FIG. 1 is a schematic cross-sectional view showing an example of a substrate processing apparatus including a placing table according to an embodiment.

Hereinafter, embodiments of the present disclosure will be described in detail with reference to the accompanying drawings. Like reference numerals will be given to like or corresponding parts throughout the drawings, and redundant description thereof may be omitted.

In this specification, directions such as parallel, right-angled, orthogonal, horizontal, vertical, up and down, and left and right are allowed to deviate without spoiling the effect of the embodiment. The shape of a corner is not limited to a right angle and may be rounded in an arch shape. The terms parallel, right-angled, orthogonal, horizontal, vertical, circular, and equal may include substantially parallel, substantially right-angled, substantially orthogonal, substantially horizontal, substantially vertical, substantially circular, and substantially equal, respectively.

(Substrate Processing Apparatus)

A substrate processing apparatus (vacuum processing apparatus, sputtering apparatus) 1 will be described with reference to FIG. 1. FIG. 1 is a schematic cross-sectional view showing an example of a substrate processing apparatus 1 including a placing table 20 according to one embodiment. The substrate processing apparatus 1 is a physical vapor deposition (PVD) apparatus. In the substrate processing apparatus 1, film formation is performed on a substrate W such as a semiconductor wafer or the like in a processing chamber by adhering (depositing) sputtered particles (film forming atoms) emitted from multiple targets T to the surface of the substrate W placed on the placing table 20. Further, the substrate processing apparatus 1 is a magnetron sputtering apparatus including a cathode part 2 as a sputtering source at the ceiling (lid) portion of the processing chamber 10.

The substrate processing apparatus 1 includes the processing chamber 10 having an inner space 10s for performing film formation on the substrate W. The processing chamber 10 has a center axis Ax located at the center of the film formation on the substrate W in the inner space 10s and extending along a vertical direction. The center axis Ax is set to penetrate through the center of the substrate W placed on the placing table 20. The cathode part 2 is disposed at the ceiling portion of the processing chamber 10, and is configured to sputter the targets T. The cathode part 2 has a pyramid-shaped portion 113 having a substantially pyramid shape (for example, a substantially quadrangular pyramid shape, a conical shape, or the like) at the ceiling portion located above the placing table 20. The center axis Ax is configured to penetrate through the center (apex) of the pyramid-shaped portion 113. The center of the upper surface of the electrostatic chuck 21 (the placing surface of the substrate W) coincides with the center axis Ax.

The processing chamber 10 is made of aluminum, for example. The processing chamber 10 is connected to a ground potential. In other words, the processing chamber 10 is grounded. The processing chamber 10 has a loading/unloading port 111 through which the inner space 10s and the outside of the processing chamber 10 communicate, and a gate valve 112 for opening and closing the loading/ unloading port 111. In the substrate processing apparatus 1, when the gate valve 112 is opened, the substrate W is loaded and unloaded through the loading/unloading port 111 by a transfer device (not shown). Further, the processing chamber 10 is evacuated by operating an exhaust device (not shown) such as a vacuum pump or the like so that the inside of the inner space 10s becomes a desired vacuum (decompressed) state.

A placing table 20 for placing the substrate W thereon is disposed in the processing chamber 10. The placing table has an electrostatic chuck 21, a freezing device 30, and a power controller 39. The electrostatic chuck 21 has a base 23 made of an insulating material such as quartz or the like, and a chuck portion 22 disposed on the base 23 and having a chuck electrode 21a therein. In other words, the electrostatic chuck 21 has a structure in which the chuck portion 22, that is a thermally sprayed film including upper and lower insulating films and a metal film (chuck electrode 21a) embedded therebetween, is coated on the base 23 made of an insulating member such as quartz or the like. The electrostatic chuck 21 of the placing table 20 is configured to be rotatable by a rotating device to be described later.

The substrate processing apparatus 1 includes a slip ring 60 made of a metal in order to supply a chucking voltage (direct current (DC) voltage) to the chuck electrode 21a. Accordingly, the power controller 39 applies the chuck voltage supplied from a direct current (DC) power supply 37 to the chuck electrode 21a through the slip ring 60 and a power supply line 63. Hence, a predetermined potential is applied to the chuck electrode 21a. With this configuration, the substrate W can be electrostatically attracted to and held on a placing surface 20a of the electrostatic chuck 21.

The power controller 39 has a splitter 38, and is configured to superimpose an RF bias voltage applied to the electrostatic chuck 21 on the chuck voltage applied to the chuck electrode 21a. The power controller 39 applies a chuck voltage from the DC power supply 37 to the chuck electrode 21a. The power controller 39 superimposes an RF bias voltage having a frequency of 400 kHz, for example, supplied from an RF power supply 36 (high frequency power supply) through the splitter 38 on the chuck voltage, and applies the superimposed voltage to the electrostatic chuck 21 in a state where the substrate W is attracted and held on the placing surface 20a of the electrostatic chuck 21. However, the RF bias voltage supplied from the RF power supply 36 does not necessarily have a high frequency of 400 kHz. The RF power supply 36 is connected to a matching device 35 for efficiently applying an RF bias voltage to the electrostatic chuck 21, and is connected to the splitter 38 via the matching device 35.

The freezing device 30 is disposed below the electrostatic chuck 21. The freezing device 30 is formed by stacking a refrigerator 31 and a refrigeration medium 32. The refrigeration medium 32 is also referred to as cold link. The refrigerator 31 holds the refrigeration medium 32 and cools the upper surface of the refrigeration medium 32 to an extremely low temperature. The refrigerator 31 preferably uses a Gifford-McMahon (GM) cycle in view of cooling performance. The refrigeration medium 32 is fixed on the refrigerator 31, and an upper portion of the refrigeration medium 32 is accommodated in the processing chamber 10. The refrigeration medium 32 is made of a material having high thermal conductivity (for example, Cu), and has a substantially cylindrical outer shape. The refrigeration medium 32 is disposed such that the center thereof coincides with the center axis Ax of the placing table 20.

The freezing device 30 has a contact surface 30a that is in contact with or separated from a surface 20b to be contacted of the electrostatic chuck 21 (i.e., a surface of the electrostatic chuck 21 opposite to the placing surface 21a), and is configured to cool the electrostatic chuck 21. During cooling, the surface 20b to be contacted of the electrostatic chuck 21 and the contact surface 30a of the freezing device 30 are brought into contact with each other to cool the electrostatic chuck 21 to an extremely low temperature. Thereafter, during processing of the substrate W, the surface 20b to be contacted of the electrostatic chuck 21 and the contact surface 30a of the freezing device 30 are separated from each other, and the electrostatic chuck 21 is rotated.

For example, the freezing device 30 may be in contact with the surface 20b to be contacted of the electrostatic chuck 21 and cool the electrostatic chuck 21 so that the temperature of the substrate W attracted and held on the placing surface 20a becomes 150K (Kelvin) or lower. Further, the freezing device 30 may be in contact with the surface 20b to be contacted of the electrostatic chuck 21 and cool the electrostatic chuck 21 so that the temperature of the substrate W becomes 210K (Kelvin) or lower.

The freezing device 30 is at least partially made of a metal such as copper or the like, and is connected to the ground potential. In the present embodiment, the portion of the freezing device 30 other than the refrigerator 31 is made of copper.

Further, the electrostatic chuck 21 is rotatably supported by a rotating device 40. The rotating device 40 has a rotation driving device 41, a fixed shaft 45, a rotation shaft 44, a housing 46, magnetic fluid seals 47 and 48, and a stand 49.

The rotation driving device 41 is a direct drive motor having a rotor 42 and a stator 43. The rotor 42 has a substantially cylindrical shape extending coaxially with the rotation shaft 44 and is fixed to the rotation shaft 44. The stator 43 has a substantially cylindrical shape with an inner diameter larger than the outer diameter of the rotor 42. The rotation driving device 41 may be in a form other than a direct drive motor, and may be in a form including a servomotor and a transmission belt.

The rotation shaft 44 has a substantially cylindrical shape extending coaxially with the center axis Ax of the placing table 20. The fixed shaft 45 is provided inside the rotation shaft 44 in a radial direction. The fixed shaft 45 has a substantially cylindrical shape extending coaxially with the center axis Ax of the placing table 20. The housing 46 is provided outside the rotation shaft 44 in a radial direction. The housing 46 has a substantially cylindrical shape extending coaxially with the center axis Ax of the placing table 20 and is fixed to the processing chamber 10.

The magnetic fluid seal 47 is provided between the outer peripheral surface of the fixed shaft 45 and the inner circumference of the rotation shaft 44. The magnetic fluid seal 47 rotatably supports the rotation shaft 44 with respect to the fixed shaft 45, and seals the gap between the outer peripheral surface of the fixed shaft 45 and the inner circumference of the rotation shaft 44 to separate the inner space 10s of the decompressible processing chamber 10 from the outer space of the processing chamber 10. Further, the magnetic fluid seal 48 is provided between the inner peripheral surface of the housing 46 and the outer circumference of the rotation shaft 44. The magnetic fluid seal 48 rotatably supports the rotation shaft 44 with respect to the housing 46 and seals the gap between the inner peripheral surface of the housing 46 and the outer circumference of the rotation shaft 44 to separate the inner space 10s of the decompressible processing chamber 10 from the outer space of the processing chamber 10. Accordingly, the rotation shaft 44 is rotatably supported by the fixed shaft 45 and the housing 46.

Further, the refrigeration medium 32 is inserted through the radially inner side of the fixed shaft 45. The stand 49 is provided between the rotation shaft 44 and the placing table 20, and is configured to transmit the rotation of the rotation shaft 44 to the stand 49.

With the above configuration, when the rotor 42 of the rotation driving device 41 rotates, the rotation shaft 44, the stand 49, and the electrostatic chuck 21 rotate relative to the refrigeration medium 32 in the X1 direction shown in FIG. 1.

Further, the freezing device 30 is supported by a lifting device 50 to be vertically movable. The lifting device 50 has an air cylinder 51, a link mechanism 52, a freezing device support 53, a linear guide 54, a fixed portion 55, and a bellows 56.

The air cylinder 51 is a mechanical device whose rod moves linearly by air pressure. The link mechanism 52 converts the linear motion of the rod of the air cylinder 51 into vertical motion of the freezing device support 53. Further, the link mechanism 52 has a lever structure, one end of which is connected to the air cylinder 51 and the other end of which is connected to the freezing device support 53. Accordingly, a large pressing force can be generated with a small thrust of the air cylinder 51. The freezing device support 53 supports the freezing device 30 (the refrigerator 31 and the refrigeration medium 32). Further, the moving direction of the freezing device support 53 is guided in the vertical direction by the linear guide 54.

The fixed portion 55 is fixed to the lower surface of the fixed shaft 45. The substantially cylindrical bellows 56 surrounding the refrigerator 31 is provided between the lower surface of the fixed portion 55 and the upper surface of the freezing device support 53. The bellows 56 is a metal bellows structure that is vertically expandable. Accordingly, the fixed portion 55, the bellows 56, and the freezing device support 53 seal the gap between the inner peripheral surface of the fixed shaft 45 and the outer circumference of the refrigeration medium 32 to separate the inner space 10s of the decompressible processing chamber 10 from the outer space of the processing chamber 10. Further, the lower surface side of the freezing device support 53 is adjacent to the outer space of the processing chamber 10, and the region surrounded by the bellows 56 on the upper surface side of the freezing device support 53 is adjacent to the inner space 10S of the processing chamber 10.

The slip ring 60 is provided below the rotation shaft 44 and the housing 46. The slip ring 60 has a rotating body 61 including a metal ring and a fixed body 62 including a brush. The rotating body 61 has a substantially cylindrical shape extending coaxially with the rotation shaft 44, and is fixed to the lower surface of the rotation shaft 44. The fixed body 62 has a substantially cylindrical shape with an inner diameter slightly larger than an outer diameter of the rotating body 61, and is fixed to the lower surface of the housing 46. The slip ring 60 is electrically connected to the DC power supply 37 and the RF power supply 36 via the splitter 38. The slip ring 60 supplies the chuck voltage and the RF bias voltage supplied from the DC power supply 37 and the RF power supply 36 to the power supply line 63 via the brush of the fixed body 62 and the metal ring of the rotating body 61. With this configuration, the chuck voltage can be applied from the DC power supply 37 to the chuck electrode 21 and the RF bias voltage can be applied from the RF power supply 36 to the electrostatic chuck 21 without twisting the power supply line 63. The structure of the slip ring 60 may be a structure other than the brush structure, for example, a contactless power supply structure, a mercury-free structure, a structure containing a conductive liquid, or the like.

The cathode part 2 configured to sputter the targets T is disposed at the upper portion of the processing chamber 10 to face the placing table 20.

The cathode part 2 has a target holder 130, a target cover 140, a gas supply part 150, and a magnet mechanism 170. The target holder 130 holds the targets T that are cathode targets at positions spaced apart from the placing table 20. The substrate processing apparatus 1 shown in FIG. 1 includes two target holders 130. However, the number of targets T may be two or more, and may be four, for example.

The target holder 130 has metal holders 131 for holding the targets T, and insulating members 132 for supporting the holders 131 while fixing the outer peripheral portions of the holders 131.

The targets T held by the holders 131 are made of a material containing a film forming substance. Each of the targets T has a rectangular flat plate shape. Further, the substrate processing apparatus 1 may include targets T made of different materials. For example, a multilayer film can be formed in the processing chamber 10 by performing sputtering while switching targets T made of different materials. In other words, the substrate processing apparatus 1 may perform simultaneous sputtering (co-sputtering) for simultaneously performing film formation using multiple targets. In the substrate processing apparatus 1 according to an embodiment, a silicon (Si) film or the like is formed on the substrate W, as an example of the film formation.

Each of the holders 131 is formed in a rectangular shape that is considerably larger than the target T in plan view. The holders 131 are fixed to the inclined surface of the pyramid-shaped portion 113 via the insulating members 132. Since the holders 131 are fixed to the inclined surface of the pyramid-shaped portion 113, the holders 131 maintain a state in which the surfaces of the targets T (sputtering surfaces exposed in the inner space 10s) are inclined with respect to the center axis Ax.

Either one or both of a direct current (DC) power supply or a radio frequency (RF) power supply may be connected to the cathode part 2, but the present disclosure is not limited thereto. When only a DC power supply is connected to the cathode part 2, sputtering is performed using a DC magnet as a magnet 171. When both the DC power supply and the RF power supply are connected to the cathode part 2, sputtering is performed by activating ionized particles using a point-cusp-magnetic field (PCM) magnet as the magnet 171. In the following description, a case where both a DC power supply 191 (direct current power supply) and an RF power supply 137 (high frequency power supply) are connected to the cathode part 2 will be described as an example.

The target holder 130 electrically connects the DC power supplies 191 to the targets T held by the holders 131. Each of the DC power supplies 191 applies a pulse wave of a negative DC voltage to a target T having one end connected to the ground potential and the other end connected to the DC power supply 191 via a low pass filter (LPF) 193. The DC power supply 191 may be a single power supply for selectively applying a negative DC voltage to each of the targets T.

The RF power supply 137 has one end connected to the ground potential and the other end connected to a matching device 136. The matching device 136 is connected to a power supply line that connects the DC power supply 191 and the holder 131. Therefore, the RF power source 137 is connected to the holder 131 via the matching device 136.

The RF power supply 137 superimposes the RF voltage on the DC voltage via the matching device 136 and applies the RF voltage superposed on the DC voltage from the holder 131 to the target T. Accordingly, sputtering is performed by superimposing the negative DC voltage pulse wave and the RF voltage, and the sputtered particles can be ionized with high efficiency. Further, the ionization efficiency can be further increased by using the magnet 171 for generating PCM that is local magnetic field for plasma discharge. The ionized sputtered particles thus generated can be attracted to the electrostatic chuck 21 by the RF bias voltage, so that the embedding accuracy of the Cu film can be improved.

Here, the RF power applied by the RF power supply 137 has a VHF band frequency (e.g., 60 MHz) and preferably 30 kW or less. The matching device 136 efficiently applies the RF voltage to the target T. Sputtered particles of a high-resistance material, which are emitted from the targets T, are adhered to the substrate W, thereby forming a film. The RF power supply 137 may be a single power supply for selectively applying an RF voltage to each of the targets T.

A metal target shield (anti-adhesion shield) 135 is disposed to surround the target T held by the holder 131. The target shield 135 has an opening through which the target T is exposed, and is fixed to the inclined surface of the pyramid-shaped portion 113 via the insulating member 132. In other words, the insulating member 132 is disposed between the processing chamber 10 connected to the ground potential and the target shield 135. Accordingly, the target shield 135 is not electrically connected to the processing chamber 10, and thus may have a potential different from the ground potential. Further, the target shield 135 and the holder 131 are not electrically connected.

A pulse oscillator 192 is disposed between and connected to the DC power supply 191 and the RF power supply 137. The pulse oscillator 192 synchronizes the pulse frequency of the pulse wave of the DC voltage from the DC power supply 191 with the frequency of the radio frequency power (RF voltage) from the RF power supply 137. Accordingly, the target T can be sputtered by superimposing the negative DC voltage and the RF voltage while reducing the power loss of both the pulse wave of the negative DC voltage and the RF voltage.

The low pass filter (LPF) 193 is disposed on the power supply line between the DC power supply 191 and the holder 131, and functions as a high frequency filter for preventing the RF voltage from the RF power supply 137 from flowing into the DC power supply 191.

The magnet mechanism 170 applies magnetic field to each target T. By applying magnetic field to each target T, the magnet mechanism 170 induces plasma to the target T. The magnet mechanism 170 includes, for each of the holders 131, the magnet 171 (cathode magnet), and a driving device 172 for supporting and driving the magnet 171. In other words, the magnet 171 can be driven by the driving device 172.

The substrate processing apparatus 1 according to an embodiment includes two magnets 171 and two driving devices 172 for respectively holding the two magnets 171 to correspond to the two holders 131.

The magnets 171 have the same shape, and generate substantially the same level of magnetic forces. Specifically, the magnets 171 has a substantially rectangular shape in plan view. In the holding state of the driving device 172, the long sides of the magnets 171 extend in parallel to the short sides of the rectangular targets T, whereas the short sides of the magnets 171 extend in parallel to the long sides of the rectangular targets T.

The magnets 171 may be permanent magnets. The material of the magnets 171 is not particularly limited as long as it has an appropriate magnetic force, and may be, for example, iron, cobalt, nickel, samarium, neodymium, or the like.

Each driving device 172 holding each magnet 171 reciprocates the held magnet 171 along the longitudinal direction of the targets T. In other words, the magnets 171 are movable. Further, each driving device 172 holding each magnet 171 move the held magnets 171 to be close to or distant from the targets T. Specifically, each driving device 172 includes a reciprocating mechanism 174 for holding and reciprocating the magnet 171, and an approaching/separating mechanism 175 for holding and moving the reciprocating mechanism 174 to be close to or distant from the target T.

The target cover 140 of the substrate processing apparatus 1 has a shutter main body 141 disposed in the processing chamber 10, and a shutter driving device 142 for supporting and driving the shutter main body 141.

The shutter body 141 is disposed between the multiple targets T and the placing table 20. The shutter main body 141 is formed in a pyramid shape substantially parallel to the inclined surface of the pyramid-shaped portion 113 of the processing chamber 10. The shutter main body 141 can face the sputtering surfaces of the targets T. Further, the shutter body 141 has one opening 141*a* that is slightly larger than the target T.

The opening 141*a* is disposed to face one of the targets T (selected target Ts) by the shutter driving device 142. When the opening 141*a* is disposed to face the selected target Ts, the shutter main body 141 exposes only the selected target Ts to the substrate W on the placing table 20. The shutter main body 141 does not expose other targets T (non-selected targets).

The shutter driving device 142 includes a columnar rotation shaft 143, and a rotating part 144 for rotating the rotation shaft 143. The axis of the rotation shaft 143 coincides with the center axis Ax of the processing chamber 10. The rotation shaft 143 extends along the vertical direction, and fixes the center (apex) of the shutter body 141 at the lower end thereof. The rotation shaft 143 protrudes to the outside of the processing chamber 10 while penetrating through the center of the pyramid-shaped portion 113.

The rotating part 144 is disposed outside the processing chamber 10, and rotates the rotation shaft 143 relative to the upper end (connector 155*a*) holding the rotation shaft 143 via a rotation transmission part (not shown). Accordingly, the rotation shaft 143 and the shutter main body 141 rotate about the center axis Ax. Therefore, the target cover 140 can adjust the circumferential position of the opening 141*a* under the control of the controller 70 so that the opening 141*a* can face the selected target Ts to be sputtered.

The substrate processing apparatus 1 uses the target cover 140 to perform sputtering while switching targets. However, the substrate processing apparatus 1 may not include the target cover 140, and perform simultaneous sputtering.

The gas supply part 150 includes an excitation gas part 151 disposed at the pyramid-shaped portion 113 to supply an excitation gas. The excitation gas part 151 has a line 152 for circulating a gas outside the processing chamber 10. The excitation gas part 151 has a gas source 153, a flow rate controller 154, and a gas inlet 155 in that order from the upstream side to the downstream side of the line 152.

The gas source 153 stores an excitation gas (e.g., Ar gas). The gas source 153 supplies a gas to the line 152. The flow rate controller 154 may be, for example, a mass flow controller or the like, and adjusts the flow rate of the gas supplied into the processing chamber 10. The gas inlet 155 introduces a gas from the outside of the processing chamber into the processing chamber 10. The gas inlet 155 includes the connector 155a connected to the line 152 at the outside of the processing chamber 10, and a gas channel 143a formed in the rotation shaft 143 of the target cover 140.

A gas outlet (not shown) of the substrate processing apparatus 1 has a decompression pump, and an adapter for fixing the decompression pump to the bottom portion of the processing chamber 10. The gas outlet decreases a pressure in the inner space 10s of the processing chamber 10.

The controller 70 is a computer and controls individual components of the substrate processing apparatus 1. The controller 70 includes a main controller having a CPU for controlling individual components, an input device, an output device, a display device, and a storage device. The storage device stores parameters of various processes performed by the substrate processing apparatus 1. A storage medium that stores a program, i.e., a processing recipe, for controlling the processes executed in the substrate processing apparatus 1 is set in the storage device. The main controller of the controller 70 reads out a predetermined processing recipe stored in the storage medium, and causes the substrate processing apparatus 1 to execute predetermined processing based on the processing recipe.

(Film Forming Method)

Figure 2:
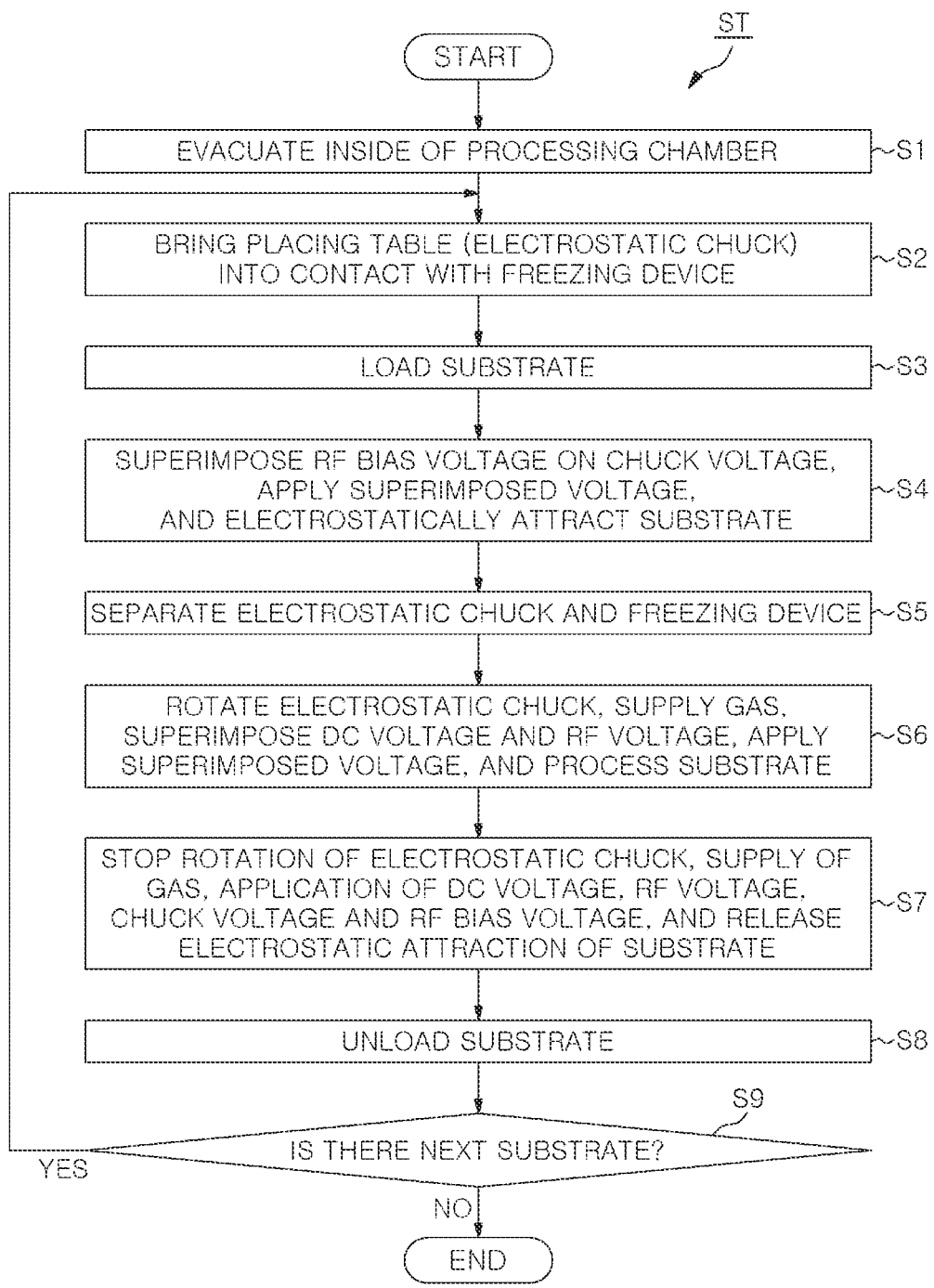
FIG. 2 is a flowchart showing an example of a film forming method according to an embodiment.

Next, an example of a film forming method ST using the substrate processing apparatus 1 will be described with reference to FIG. 2. FIG. 2 is a flowchart showing an example of the operation of the substrate processing apparatus 1 according to an embodiment. The film formation shown in FIG. 2 is controlled by the controller 70 and executed by the substrate processing apparatus 1.

When the film forming method ST is started, in step S1, the controller 70 controls the gas exhaust part to evacuate (decompress) the inside of the processing chamber 10 to a predetermined vacuum level.

Next, in step S2, the controller 70 brings the electrostatic chuck 21 of the placing table 20 into contact with the freezing device 30 to cool the electrostatic chuck 21 to an extremely low temperature (for example, 150K or lower).

Next, in step S3, the controller 70 prepares the substrate W on the electrostatic chuck 21 in the processing chamber 10. Specifically, the controller 70 opens gate valve 112. The substrate W is loaded into the processing chamber through the loading/unloading port 111 by a transfer device (not shown) and placed on the electrostatic chuck 21. When the transfer device is retracted from the loading/unloading port 111, the controller 70 closes the gate valve 112.

Next, in step S4, the controller 70 controls the DC power supply 37 to apply a chuck voltage to the chuck electrode 21a of the electrostatic chuck 21, so that the substrate W is electrostatically attracted to the electrostatic chuck 21. Further, the controller 70 controls the RF power supply 36 to apply an RF voltage to the electrostatic chuck 21. Since the substrate W is electrostatically attracted to the electrostatic chuck 21, the cooling efficiency can be improved. Further, the heat transfer efficiency can be increased by providing a heat transfer gas channel (not shown) in the electrostatic chuck 21 and supplying a heat transfer gas to the gap between the substrate W and the electrostatic chuck 21.

Next, the controller 70 performs film formation on the substrate W. Specifically, in step S5, the controller 70 controls the lifting device 50 to separate the electrostatic chuck 21 and the freezing device 30.

Next, in step S6, the controller 70 controls the rotating device 40 to rotate the electrostatic chuck 21 holding the substrate W. Further, the controller 70 controls the flow rate controller 154 to supply an excitation gas (for example, Ar gas) supplied from the gas supply part 150 into the processing chamber 10. Moreover, the controller 70 superimposes the DC voltage and the RF voltage and applies the superimposed voltage to the target T. Therefore, ions in the excitation gas dissociated around the targets T collide with the targets T, and sputtered particles are emitted from the targets T into the inner space 10s. The sputtered particles of the targets T can be ionized with high efficiency. The ions can be attracted to the substrate W during film formation by the RF bias voltage applied to the electrostatic chuck 21. Accordingly, the sputtered particles are efficiently adhered (deposited) to the recess of the substrate W, and the recess of the substrate W can be filled with the Cu film.

During film formation, the controller 70 may control the driving device 172 to cause the magnet 171 to oscillate (reciprocate). Accordingly, plasma is induced by the magnetic field of the magnet 171. In other words, the sputter discharge area of the targets T is controlled by controlling the oscillation width of the magnet 171.

When the film formation is completed, in step S7, the controller 70 controls the rotating device 40 to stop the rotation of the electrostatic chuck 21. Further, the controller 70 stops the supply of the excitation gas from the gas supply part 150. Further, the controller 70 stops the application of the DC voltage and the RF voltage to the cathode part 2. Further, the controller 70 stops the application of the chuck voltage and the RF bias voltage to the electrostatic chuck 21, and releases the electrostatic attraction of the substrate W to the electrostatic chuck 21.

Next, in step S8, the controller 70 opens the gate valve 112. The substrate W is unloaded from the processing chamber through the loading/unloading port 111 by a transfer device (not shown). When the transfer device is retracted from the loading/unloading port 111, the controller 70 closes the gate valve 112.

Next, if it is determined in step S9 that there is a next substrate W, the processing returns to step S2, and the next substrate W is subjected to subsequent processes after step S2. If it is determined in step S9 that there is no next substrate W, the processing is completed.

As described above, in the substrate processing apparatus 1, a film is formed by adhering sputtered particles emitted from the targets T to the surface of the substrate W. In this case, the ionized sputtered particles can be efficiently attracted to the placing table 20 by superimposing a chuck voltage and an RF bias voltage and applying the superimposed voltage to the electrostatic chuck 21 of the placing table 20.

In the substrate processing apparatus 1, when a Cu film is formed by sputtering in the recess formed on the substrate W, grains grow until the crystallization of the formed Cu film becomes stable. The surface roughness of the film increases as the grain diameter increases. Therefore, it is difficult to form a flat film at a nano level.

However, in the film forming method ST of the present embodiment, the temperature of the substrate W during film formation is lowered to, for example, 150K or lower, and further to an extremely low temperature of 210K or lower. By forming a Cu film while cooling the substrate W to an extremely low temperature, the aggregation of Cu particles can be suppressed, and the sheet resistance and the surface roughness can be reduced compared to the case of performing film formation at room temperature. Accordingly, the grain growth of Cu particles adhered to the substrate W can be suppressed, which makes it possible to form a flat Cu film on the substrate W at a nano level.

In manufacturing semiconductor devices, Cu is a typical material used for wiring. In the film forming method ST of the present embodiment, a Cu film wiring forming process is performed in an extremely low temperature environment, and an RF bias voltage is applied to the placing table 20 (the electrostatic chuck 21) on which the substrate W is placed. Accordingly, an ionized sputtering method for attracting ionized sputter particles into a recess such as a trench or the like and filling the recess with a Cu wiring layer is performed.

The refrigerator 31 is connected to the ground potential. The refrigeration medium 32 is made of Cu. Cu is a highly conductive material. When the electrostatic chuck 21 is made of Cu (copper), a radio frequency current flowing through the electrostatic chuck 21 by applying an RF bias voltage to the electrostatic chuck 21 mainly flows toward the refrigeration medium 32 as indicated by a path B of FIG. 3. Accordingly, the radio frequency current is unlikely to flow from the electrostatic chuck 21 to the wall of the processing chamber connected to the ground potential through the ionized sputtered particles as indicated by a path A of FIG. 3. As a result, it is difficult to apply the RF bias voltage to the substrate W and, thus, the efficiency of filling Cu into the recess such as a trench or the like formed in the substrate W deteriorates.

Therefore, as shown in FIG. 1, the electrostatic chuck 21 of the present embodiment has a structure in which a thermally sprayed film formed of upper and lower insulating films and a metal film (the chuck electrode 21a) disposed therebetween is coated on the base 23 made of an insulating member such as quartz or the like. The chuck voltage is applied to the electrode layer (the chuck electrode 21a) disposed above the base 23 of the electrostatic chuck 21 having the above structure. In the present embodiment, the base 23 of the electrostatic chuck 21 is made of an insulating member, so that the RF bias current is unlikely to flow toward the position below the base 23. Accordingly, the radio frequency current flowing through the electrostatic chuck 21 is unlikely to flow toward the refrigeration medium 32 as indicated by the path B of FIG. 3. Hence, the radio frequency current is likely to flow as indicated by the path A of FIG. 3. As a result, the RF bias voltage can be easily applied to the ionized particles.

Figure 3:
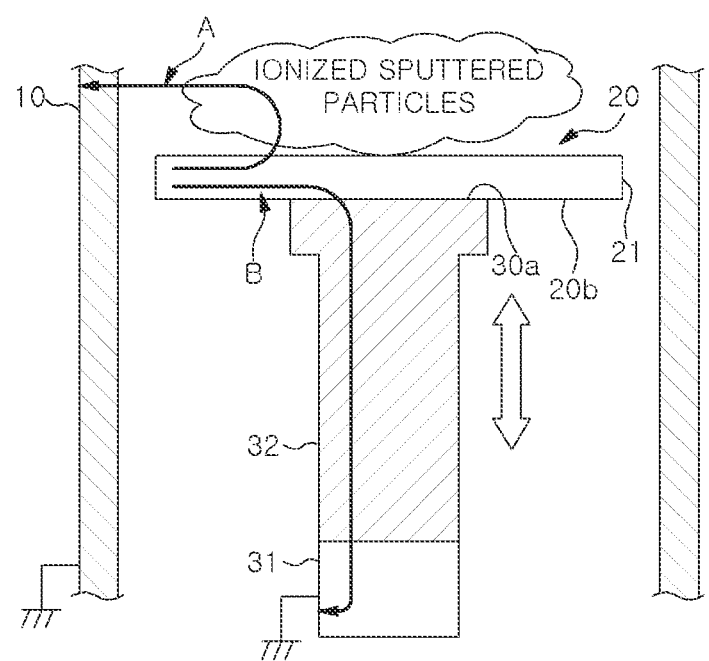
FIG. 3 shows an example of flow of a radio frequency current.

However, even if an insulating member such as quartz or the like is used for the base 23 of the electrostatic chuck 21, the radio frequency current flowing through the path B of FIG. 3 cannot be completely insulated. Therefore, abnormal discharge between the electrostatic chuck 21 and the freezing device 30 can be prevented by separating the contact surface 30a of the freezing device 30 and the surface to be contacted 20b of the electrostatic chuck 21 and setting the distance between the contact surface 30a and the surface to be contacted 20b to be smaller than or equal to a sheath length.

As described above, in accordance with the placing table and the substrate processing apparatus 1 of the present embodiment, a flat Cu film can be formed on the substrate W by cooling the substrate to an extremely low temperature area. Further, the ionized Cu particles can be efficiently attracted to the recess such as a trench or the like formed on the substrate W, which makes it possible to form a Cu film having a low sheet resistance.

(Test Results)

Figure 4:
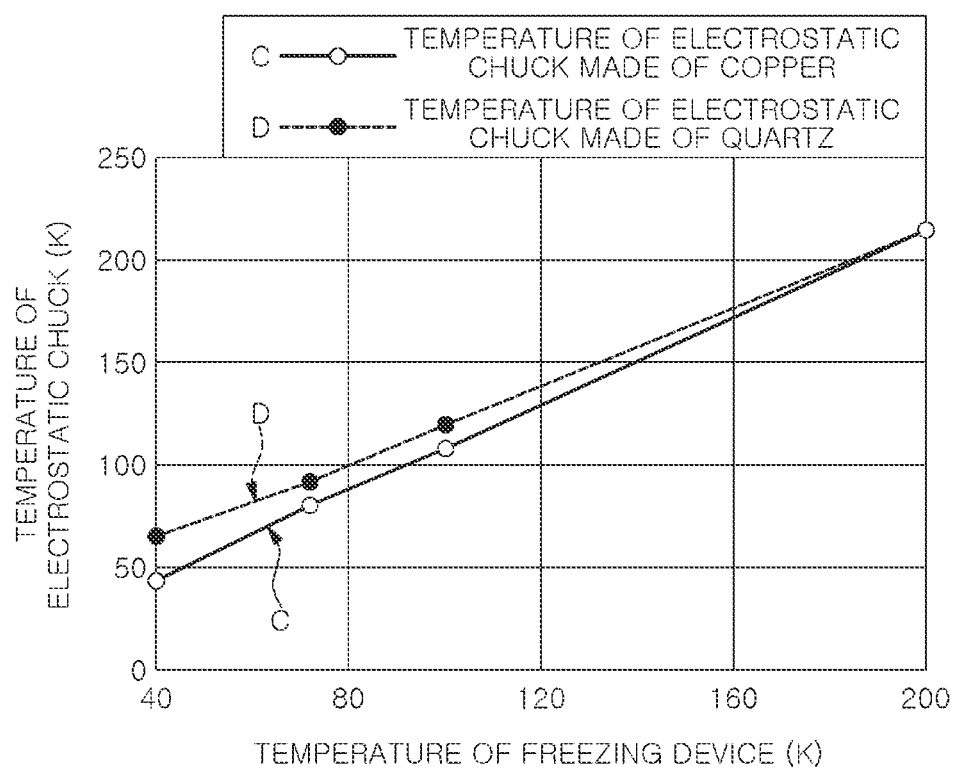
FIG. 4 shows an example of correlation between a temperature of a freezing device and a temperature of an electrostatic chuck.

Test results showing an example of the correlation between the temperature of the freezing device 30 and the temperature of the electrostatic chuck 21 will be described with reference to FIG. 4. FIG. 4 showing an example of the correlation between the temperature of the freezing device 30 and the temperature of the electrostatic chuck 21.

In FIG. 4, the horizontal axis represents a temperature (K: Kelvin) of the freezing device 30, and the vertical axis represents a temperature (K: Kelvin) of the electrostatic chuck. A straight line C indicates a temperature of the electrostatic chuck in the case where the base 23 of the electrostatic chuck 21 is made of copper. A straight line D indicates a temperature of the electrostatic chuck 21 in the case where the base 23 of the electrostatic chuck 21 is made of quartz. Other parts of the electrostatic chuck 21 are made of the same material.

According to the test results of FIG. 4, the cooling efficiently was slightly lower when the base 23 of the electrostatic chuck 21 was made of quartz (the straight line D) than when the base was made of copper (the straight line C). However, even when the base of the electrostatic chuck 21 was made of quartz, it was possible to cool the electrostatic chuck 21 to an extremely low temperature of 210K or lower by the freezing device 30, similarly to when the base was made of copper.

From the above result, it was clear that even when the base 23 of the electrostatic chuck 21 was made of quartz, it was possible to reduce the sheet resistance and the surface roughness of the Cu film by setting the temperature of the substrate W to 210K or lower before the formation of the Cu film.

As described above, in the placing table 20 of the present embodiment an insulating material such as quartz is used for the base 23 of the electrostatic chuck 21 for controlling the temperature of substrate W to at least 150K or lower, more preferably 210K or lower. Accordingly, a structure that blocks the radio frequency current flowing toward the freezing device 30, and a structure that superimposes the chuck voltage of the electrostatic chuck 21 and the RF bias voltage for applying the RF bias voltage are provided.

Hence, it is possible to cool the substrate W to an extremely low temperature and suppress the grain growth of sputtered particles while facilitating the attraction of ions. Further, the RF bias voltage can be superimposed on the chuck voltage via the splitter 38, so that the ionized sputtered particles can be efficiently attracted to the placing table 20.

It should be considered that the placing table 20 and the substrate processing apparatus 1 according to the embodiments of the present disclosure are illustrative in all respects and not restrictive. The above-described embodiments may be changed and modified in various ways without departing from the scope and spirit of the appended claims. The above-described embodiments may include other configurations without contradiction and may be combined without contradiction.

For example, the attraction method using the electrostatic chuck 21 can be applied to the attraction method using the Johnson-Rahbek force as well as the attraction method using the Coulomb force.

The invention claimed is:

1. A film forming method for forming a wiring by a sputtering method using physical vapor deposition, the method comprising:

bringing a contact surface of a freezing device into contact with a rear surface of an electrostatic chuck included in a placing table to cool the electrostatic chuck to a temperature of 150K or lower;

mounting a substrate on a placing surface of the electrostatic chuck and applying a chuck voltage to a chuck electrode embedded in the electrostatic chuck so that the substrate is electrostatically attracted to and held on the placing surface;

separating the freezing device from the electrostatic chuck by controlling a lifting mechanism; and performing a film forming step including rotating the electrostatic chuck holding the substrate, supplying an excitation gas into a processing chamber, superimposing an RF bias voltage on the chuck voltage and applying the superimposed voltage to the electrostatic chuck.

2. The film forming method of claim 1,
wherein the chuck voltage is applied to the chuck electrode from a DC power supply, and the RF bias voltage is supplied from a radio frequency power supply through a splitter and superimposed on the chuck voltage.

3. The film forming method of claim 1,
wherein the electrostatic chuck comprises a base formed of an insulating material and a chuck portion disposed on the base, the chuck electrode being embedded in the chuck portion.

4. The film forming method of claim 1,
further comprising loading the substrate into the processing chamber through a gate valve before the mounting step, and unloading the substrate from the processing chamber after the film forming step.

5. The film forming method of claim 1,
wherein a heat transfer gas is supplied to a gap between the substrate and the electrostatic chuck to enhance cooling efficiency during the cooling of the electrostatic chuck.

6. The film forming method of claim 1,
wherein the freezing device is at least partially made of a metal and is electrically connected to ground potential.

7. The film forming method of claim 1,
wherein the excitation gas supplied into the processing chamber is argon gas.

8. The film forming method of claim 1,
wherein the film forming step includes oscillating a magnet to generate a magnetic field that induces plasma and controlling a sputter discharge area of the target.

9. The film forming method of claim 1,
further comprising, before the cooling of the electrostatic chuck, evacuating the processing chamber to a predetermined vacuum level.

10. The film forming method of claim 1,
wherein the electrostatic chuck comprises a base formed of an insulating material such that RF bias current is inhibited from flowing toward the freezing device.

11. The film forming method of claim 1,
wherein, after separating the freezing device from the electrostatic chuck, a distance between the contact surface of the freezing device and the rear surface of the electrostatic chuck is set to be equal to or less than a sheath length.

* * * * *